United States Patent
Xiao et al.

(10) Patent No.: US 11,500,042 B2
(45) Date of Patent: Nov. 15, 2022

(54) MAGNETIC SENSING DEVICES BASED ON INTERLAYER EXCHANGE-COUPLED MAGNETIC THIN FILMS

(71) Applicant: Brown University, Providence, RI (US)

(72) Inventors: Gang Xiao, Barrington, RI (US); Kang Wang, Providence, RI (US); Yiou Zhang, Providence, RI (US)

(73) Assignee: Brown University, Providence, RI (US)

( * ) Notice: Subject to any disclaimer, the term of this patent is extended or adjusted under 35 U.S.C. 154(b) by 0 days.

(21) Appl. No.: 17/188,608

(22) Filed: Mar. 1, 2021

(65) Prior Publication Data

US 2021/0270914 A1 Sep. 2, 2021

Related U.S. Application Data (60) Provisional application No. 62/983,285, filed on Feb. 28, 2020.

(51) Int. Cl.
*G01R 33/07* (2006.01)
*H01F 10/32* (2006.01)

(52) U.S. Cl.
CPC ....... *G01R 33/072* (2013.01); *H01F 10/3268* (2013.01); *H01F 10/3254* (2013.01)

(58) Field of Classification Search
CPC .............. G01R 33/072; H01F 10/3268; H01F 10/3254
See application file for complete search history.

(56) References Cited

U.S. PATENT DOCUMENTS

| | | |
|---|---|---|
| 6,052,263 A | 4/2000 | Gill |
| 6,233,172 B1 | 5/2001 | Chen et al. |
| 6,292,389 B1 | 9/2001 | Chen et al. |
| 6,721,145 B2 | 4/2004 | Beach |
| 6,872,467 B2 | 3/2005 | Qian et al. |
| 6,992,910 B1 | 1/2006 | Ju et al. |
| 7,226,796 B2 | 6/2007 | Pietambaram et al. |
| 7,235,408 B2 | 6/2007 | Janesky et al. |
| 7,345,852 B2 | 3/2008 | Inomata et al. |
| 7,601,547 B2 | 10/2009 | Deak |
| 7,612,969 B2 | 11/2009 | Oh et al. |
| 7,813,087 B2 | 10/2010 | Sato et al. |
| 9,129,691 B2 | 9/2015 | Khalili Amiri et al. |
| 9,147,408 B1 | 9/2015 | Zheng et al. |
| 9,640,753 B2 | 5/2017 | Sun et al. |
| 10,580,971 B2 | 3/2020 | Hu et al. |
| 2007/0268743 A1 | 11/2007 | Daughton et al. |

(Continued)

FOREIGN PATENT DOCUMENTS

| | | |
|---|---|---|
| EP | 3185245 A1 | 6/2017 |
| WO | 1998014793 A1 | 4/1998 |

OTHER PUBLICATIONS

Behet, M et al., InAs/Al0. 2Ga0. 8Sb quantum well Hall effect sensors. Sens. Actuator A Phys. 81,13-17 (2000).

(Continued)

*Primary Examiner* — Alvaro E Fortich
(74) *Attorney, Agent, or Firm* — Adler Pollock & Sheehan P.C.

(57) ABSTRACT

A magnetic sensing device includes a non-magnetic layer serving as a spacer and two magnetic layers that sandwich the spacer, and two oxide layers that sandwich the trilayer structure including the two magnetic layers and the spacer.

10 Claims, 3 Drawing Sheets

(56) References Cited

U.S. PATENT DOCUMENTS

| | | | |
|---|---|---|---|
| 2008/0206891 A1 | 8/2008 | Wang et al. | |
| 2009/0087589 A1 | 4/2009 | Guo et al. | |
| 2012/0069642 A1* | 3/2012 | Ueda | G11C 11/1659 |
| | | | 365/158 |
| 2013/0299929 A1* | 11/2013 | Watanabe | H01L 43/10 |
| | | | 257/421 |
| 2014/0321199 A1* | 10/2014 | Han | G11C 13/0002 |
| | | | 365/158 |
| 2015/0192648 A1* | 7/2015 | Campiglio | H01L 43/10 |
| | | | 324/252 |
| 2015/0213815 A1 | 7/2015 | Sapozhnikov et al. | |
| 2015/0255135 A1* | 9/2015 | Tran | H01L 43/12 |
| | | | 365/158 |
| 2016/0042779 A1 | 2/2016 | Wang et al. | |
| 2016/0315118 A1* | 10/2016 | Kardasz | H01L 43/10 |
| 2018/0301266 A1* | 10/2018 | Ou | H03B 15/006 |
| 2019/0109281 A1 | 4/2019 | Doyle et al. | |

OTHER PUBLICATIONS

Daughton, JM. GMR and SDT sensor applications. IEEE Trans. Magn. 36, 2773-2778 (2000).

Duine, R et al., Synthetic antiferromagnetic spintronics. Nat. Phys. 14, 217-219 (2018).

Fergen, I et al., Soft ferromagnetic thin films for high frequency applications. J. Magn. Magn. Mater. 242, 146-151 (2002).

Freitas, PP et al., Spin dependent tunnel junctions for memory and read-head applications. IEEE Trans. Magn. 36, 2796-2801 (2000).

Grancharov, SG et al., Bio-functionalization of monodisperse magnetic nanoparticles and their use as biomolecular labels in a magnetic tunnel junction based sensor. J Phys Chem B 109, 13030-13035 (2005).

Grünberg, P et al., Layered magnetic structures: Evidence for antiferromagnetic coupling of Fe layers across Cr interlayers. Phys. Rev. Lett. 57, 2442 (1986).

Hao, Q et al., Anomalous Hall effect and magnetic properties of FexPt100-x alloys with strong spin-orbit interaction. J. Appl. Phys. 122, 033901 (2017).

He, G et al., PicoTesla magnetic tunneling junction sensors integrated with double staged magnetic flux concentrators. Appl. Phys. Lett. 113, 242401 (2018).

Hooge, F et al., 1/$f$ noise in continuous thin gold films. Physica 45, 386-392 (1969).

Hooge, F. 1/$f$ noise is no surface effect. Phys. Lett. A 29, 139-140 (1969).

Hooge, F. Discussion of recent experiments on 1/$f$ noise. Physica 60, 130-144 (1972).

Hu, Wei & Wilson, Robert & Earhart, Christopher & Koh, Ai Leen & Sinclair, Robert & Wang, Shan. (2009). Synthetic antiferromagnetic nanoparticles with tunable susceptibilities. Journal of Applied Physics. 105. 07B508-07B508. 10.1063/1.3072028.

Jankowski, J et al., Hall sensors for extreme temperatures. Sensors 11, 876-885 (2011).

Lee, K-M et al., Temperature dependence of the interfacial magnetic anisotropy in W/CoFeB/MgO. AIP Adv. 7, 065107 (2017).

Lima, EA et al., Scanning magnetic tunnel junction microscope for high-resolution imaging of remanent magnetization Fields. Meas. Sci. Technol. 25, 105401 (2014).

Lu, Y et al., Ultrasensitive anomalous Hall effect in SiO2/Fe-Pt/SiO2 sandwich structure films. Appl. Phys. Lett. 100, 322404 (2012).

Manandhar, P et al., The detection of specific biomolecular interactions with micro-Hall magnetic sensors. Nanotechnology 20, 355501 (2009).

Parkin, S et al., Oscillations in exchange coupling and magnetoresistance in metallic superlattice structures: Co/Ru, Co/Cr, and Fe/Cr. Phys. Rev. Lett. 64, 2304 (1990).

Sampietro, M et al., Spectrum analyzer with noise reduction by cross-correlation technique on two channels. Rev. Sci. Instrum. 70, 2520-2525 (1999).

Sato, H et al., Temperature-dependent properties of CoFeB/MgO thin films: Experiments versus simulations. Phys. Rev. B 98, 214428 (2018).

Slonczewski, JC. Conductance and exchange coupling of two ferromagnets separated by a tunneling barrier. Phys. Rev. B 39, 6995 (1989).

Treutler, C. Magnetic sensors for automotive applications. Sens. Actuator A Phys. 91, 2-6 (2001).

Tsai, M-C et al., The intrinsic temperature dependence and the origin of the crossover of the coercivity in perpendicular MgO/CoFeB/Ta structures. J. Appl. Phys. 113, 17C118 (2013).

Wang, K et al., Spin torque effect on topological defects and transitions of magnetic domain phases in Ta/CoFeB/MgO. Phys. Rev. B 99, 184410 (2019).

Yang, G et al., Ultrasensitive anomalous hall effect in Ta/CoFe/Oxide/Ta multilayers. Adv. Cond. Matter Phys. 2016, 9734610(2016).

Zhang, Y et al., Low-Frequency Noise of Magnetic Sensors Based on the Anomalous Hall Effect in Fe—Pt Alloys. Sensors 19, 3537 (2019).

Zhang, Y et al., Magnetotransport and electronic noise in superparamagnetic magnetic tunnel junctions. Appl. Phys. Lett. 115, 022402(2019).

Zhu, T et al., Giant linear anomalous Hall effect in the perpendicular CoFeB thin films. Appl. Phys. Lett. 104, 202404 (2014).

Böhm, Benny et al., (2019). Antiferromagnetic domain wall control via surface spin flop in fully tunable synthetic antiferromagnets with perpendicular magnetic anisotropy Physical Review B 100. 10.1103/PhysRevB.100.140411.

* cited by examiner

MAGNETIC SENSING DEVICES BASED ON INTERLAYER EXCHANGE-COUPLED MAGNETIC THIN FILMS

CROSS REFERENCE TO RELATED APPLICATIONS

This application claims benefit from U.S. Provisional Patent Application Ser. No. 62/983,285, filed Feb. 28, 2020, which is incorporated by reference in its entirety.

STATEMENT REGARDING GOVERNMENT INTEREST

This invention was made with government support under grant number 1936221 awarded by the National Science Foundation. The government has certain rights in the invention.

BACKGROUND OF THE INVENTION

The present invention relates generally to magnetic sensors, and specifically to magnetic sensing devices based on interlayer exchange-coupled magnetic thin films.

In general, magnetic sensing devices based on interlayer exchange-coupled magnetic thin films solve a trade-off between a sensor size, sensing capability and stability that has been observed in many magnetic field sensors. Interlayer exchange-coupled magnetic thin film-based anomalous Hall sensors not only have high sensitivity, low intrinsic noise, high detectability, but also have high temperature stability and low cross-field error.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In general, in one aspect, the invention features an interlayer exchange-coupled magnetic multilayer structure for magnetic sensing device including a spacer that couples two magnetic layers that sandwich the spacer, the spacer thickness determining either the ferromagnetic coupling or the antiferromagnetic coupling between the two magnetic layers, two magnetic layers that sandwich the spacer, two magnetic layers having tunable perpendicular magnetic anisotropies, two oxide layers or other non-magnetic layers that sandwich the trilayer structure comprising two magnetic layers and the spacer, two oxide layers or other non-magnetic layers having interfaces with two magnetic layers, the interfaces determining the perpendicular magnetic anisotropies of the two magnetic layers, and a capping layer to prevent underlying layers from further oxidization on exposure to the atmosphere.

Embodiments of the invention may include one or more of the following advantages.

The magnetic sensing devices of the present invention can be fabricated with a miniaturized size.

Fabrication procedures of the magnetic sensing devices of the present invention are simple.

Compositions of the magnetic sensing devices of the present invention are cheap.

The magnetic sensing devices of the present invention have high sensitivities up to $10^4$ Ω/T.

The magnetic sensing devices of the present invention can reach high magnetic field detectability.

The magnetic sensing devices of the present invention have high temperature stability and can work within a broad temperature interval.

The magnetic sensing devices of the present invention have a low cross-field error.

Many magnetic sensing applications take place in a varying environmental conditions. The magnetic sensing devices of the present invention enable application in a wide-ranging environmental conditions, while the sensing capability remains high.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

These and other features, aspects, and advantages of the present invention will become better understood with reference to the following description, appended claims, and accompanying drawings where:

DETAILED DESCRIPTION

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

The present invention enables design and fabrication of high-performing magnetic sensors with both high sensing capability and stability. The magnetic sensors can be applied in many fields including but not limited to automotive fields, read heads in data storage devices, magnetic imaging, microscopy, Internet of things (IoT), robotics, non-destructive evaluation (NDE), medical diagnostics, electrocardiogram (ECG or EKG), electroencephalogram (EEG), biomedical applications and so forth.

In addition to being applied in industrial productions, the magnetic sensors of the present invention can be applied in scientific studies such as, for example, detection of magnetic textures in magnetic materials, in medical fields such as detection of magnetically labeled biomolecules and detection of signals from human bodies like from heart and human brains. In addition, the magnetic sensors of the present invention can detect magnetic fields within a broad field range and a broad temperature interval, broadening their applications in different fields.

More specifically, the present invention provides a platform to fabricate magnetic sensing devices that include a spacer that couples two magnetic layers, two magnetic layers that sandwich the spacer, two oxide layers that sandwich the trilayer structure including the two magnetic layers and the spacer, and a capping layer to prevent underlying layers from further oxidization on exposure to the atmosphere. The interlayer exchange coupling (IEC) between two magnetic layers and magnetic anisotropies can be tuned to control the performance of magnetic sensing devices. The magnetic sensing devices take advantage of the anomalous Hall effect of interlayer exchange-coupled magnetic thin films. The magnetic sensing devices based on interlayer exchange-coupled magnetic thin films have both high magnetic field detectability and high stability, which are desirable for magnetic sensing applications under wide ranging environmental conditions.

Figure 1A:
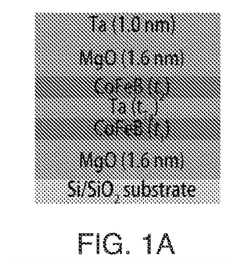
FIG. 1A is a cross-sectional schematic view of the multilayer stack.

FIG. 1A is the cross-sectional schematic view of the multilayer stack of MgO(1.6 nm)/Co$_{40}$Fe$_{40}$B$_{20}$(t$_1$)/Ta(t$_{Ta}$)/ CO$_{40}$Fe$_{40}$B$_{20}$(t$_2$)/MgO(1.6 nm)/TaO$_x$(1.0 nm) for magnetic sensing devices.

Figure 1B:
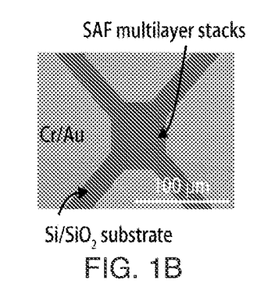
FIG. 1B is a scanning electron microscope image of a Hall bar.

FIG. 1B is the scanning electron microscope image of a Hall bar. The active area of the Hall bar is 20×20 μm$^2$.

Figure 1C:
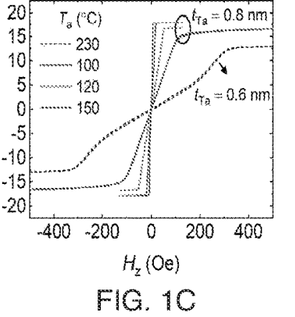
FIG. 1C is an exemplary graph.

FIG. 1C is an exemplary graph of the anomalous Hall resistance (R$_H$) as a function of the perpendicular magnetic field (H$_z$) for the magnetic thin film of Co$_{40}$Fe$_{40}$B$_{20}$(0.9 nm)/Ta(0.6 nm)/Co$_{40}$Fe$_{40}$B$_{20}$(0.9 nm), and for the magnetic thin film of Co$_{40}$Fe$_{40}$B$_{20}$(1.0 nm)/Ta(0.8 nm)/Co$_{40}$Fe$_{40}$B$_{20}$ (0.8 nm). The samples were annealed in a high-vacuum chamber at different annealing temperatures Ta for 1 h.

Figure 1D:
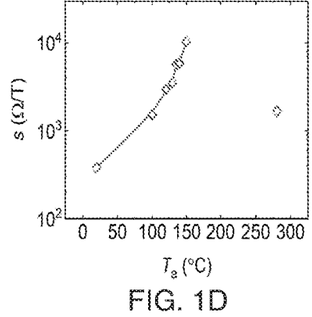
FIG. 1D is an exemplary graph.

FIG. 1D is an exemplary graph of the anomalous Hall sensitivity s as a function of the annealing temperature, for Co$_{40}$Fe$_{40}$B$_{20}$(1.0 nm)/Ta(0.8 nm)/Co$_{40}$Fe$_{40}$B$_{20}$(0.8 nm).

In various embodiments, the spacer has an interlayer exchange coupling strength at least about 0.0001 milli-joule divided by square-meters ([mJ/m$^2$), at least about 0.0005 mJ/m2, at least about 0.001 mJ/m2, at least about 0.005 mJ/m2, at least about 0.01 mJ/m2, at least about 0.05 mJ/m2, at least about 0.1 mJ/m2, at least about 0.5 mJ/m2, at least about 1 mJ/m2, at least about 5 mJ/m2. In an embodiment, the spacer is Ta. In certain embodiments, the spacer has a thickness with the range of about 0.1 nanometers (nm) to about 10.0 nm, for example, about 0.1 nm to about 1.0 nm, about 0.6 nm to 1.4 nm, about 0.5 nm to 5.0 nm, or about 5.0 nm to 10.0 nm. In various embodiments, the spacer is a metal, semiconductor, insulator or the organic material. For example, the metal, semiconductor, insulator or the organic material serving as the spacer is selected from the group consisting of: tantalum, tungsten, niobium, molybdenum, vanadium, chromium, rhenium, ruthenium, iridium, copper, rhodium, scandium, titanium, yttrium, zirconium, palladium, hafnium, osmium, platinum, gold, gallium, germanium, arsenic, selenium, indium, tin, antimony, tellurium, thallium, lead, bismuth, silicon, vanadium dioxide, gallium arsenide, magnesium oxide, and α-sexithiphene.

In various embodiments, the magnetic layer has an anomalous Hall angle at least about 0.1%, at least about 0.5%, at least about 1%, at least about 5%, at least about 10%, at least about 15%, at least about 20%, at least about 25%, at least about 30%, at least about 35%, at least about 40%, at least about 45%, at least about 50%. In various embodiments, the magnetic layer has an anomalous Hall resistivity at least about 0.1 micro-Ohm centimeters (μΩ cm), at least about 0.5μΩ cm, at least about 1μΩ cm, at least about 5μΩ cm, at least about 10μΩ cm, at least about 50μΩ cm, at least about 100μΩ cm. In certain embodiments, by tuning the magnetic anisotropies, the magnetic layer has a saturation field selected from the group consisting of: at least about 0.1 Oersted unit (Oe), at least about 1 Oe, at least about 10 Oe, at least about 100 Oe, at least about 1000 Oe, at least about 10000 Oe. In a certain embodiment, the ferromagnetic layer is the alloy of Cobalt-Iron-Boron with x, y, and 100–x–y as atomic percentage of Cobalt, Iron and Boron atoms (Co$_x$Fe$_y$B100–x–y) wherein 0<x<100 and 0<y<100 (atomic percent). In various embodiments, the magnetic layer is either the ferromagnetic layer or ferrimagnetic layer. In various embodiments, the perpendicular magnetic anisotropy is above zero, equals zero, or is below zero.

The oxide layers have interfaces with the two magnetic layers. In various embodiments, the oxide layers are selected from the group consisting of magnesium oxide, aluminum oxide, tantalum oxide, ruthenium oxide, chromium oxide, tungsten oxide, platinum oxide, silicon oxide, niobium oxide, molybdenum oxide, vanadium oxide, rhenium oxide, iridium oxide, copper oxide, rhodium oxide, scandium oxide, titanium oxide, yttrium oxide, zirconium oxide, palladium oxide, hafnium oxide, osmium oxide, gold oxide, gallium oxide, germanium oxide, arsenic oxide, selenium oxide, indium oxide, tin oxide, antimony oxide, tellurium oxide, thallium oxide, lead oxide, bismuth oxide. In certain embodiments, oxide layers are not included in structures of magnetic thin films for magnetic sensing devices. In certain embodiments, the effective perpendicular magnetic anisotropy is improved by interfacing magnetic layers with other non-magnetic layers, such as interfacing Co with the Pt layer in Co/Pt multilayers. In certain embodiments, the perpendicular magnetic anisotropy is present in a single magnetic layer without neighboring with any other materials, such as L1$_0$ ordered FeCo and FePt thin films.

In a specific embodiment, the capping layer is Ta. In various embodiments, different capping layers are used to prevent underlying layers from further oxidization.

In various embodiments, the multilayers are annealed at different annealing temperature and under different magnetic fields. The annealing temperature is selected from the group consisting of: at least about 20 degrees Celsius (° C.) at least about 50° C., at least about 100° C., at least about 150° C., at least about 200° C., at least about 250° C., at least about 300° C., at least about 350° C., at least about 400° C. In various embodiments, the perpendicular or in-plane magnetic field applied during the annealing is selected from the group consisting of at least about 0.01 Tesla (T), at least about 0.1 T, at least about 1.0 T, at least about 10 T, at least about 20 T. In certain embodiments, no magnetic field is applied during magnetic annealing processes. In certain embodiments, the as-grown multilayers are used to fabricate magnetic sensing devices.

The synthetic ferromagnetic or synthetic antiferromagnetic structures include a non-magnetic spacer and two magnetic layers that sandwich the non-magnetic spacer. In certain embodiments, oxide layers are included in the structure. Neighboring magnetic layers with oxide layers promotes the perpendicular magnetic anisotropy of magnetic layers. To give examples, we deposited multilayers of MgO (1.6)/Co$_{40}$Fe$_{40}$B$_{20}$(t$_1$)/Ta(t$_{Ta}$)/Co$_{40}$Fe$_{40}$B$_2$(t$_2$)/MgO(1.6)/ TaO$_x$(1.0) (layer thicknesses in nanometers) on thermally oxidized silicon wafers using a high-vacuum magnetron sputtering system. The cross-sectional schematic view of the multilayer stack is presented in FIG. 1A. The total thickness of the top and bottom ferromagnetic layers is fixed to be 1.8 nm (t$_1$=0.8, 0.9 and 1.0 nm). The Ta layer thickness t$_{Ta}$ varies from 0.6 to 1.4 nm. We used photolithography and ion milling to pattern multilayers into Hall bars. The scanning electron microscope (SEM) image of a Hall bar is presented in FIG. 1B. The active area of the Hall bar is 20×20 μm². In order to reduce the Johnson noise that shows a positive correlation with the resistance between two Hall voltage leads, we deposited Cr/Au layers as electrodes. The post-growth thermal annealing was then performed in a high-vacuum chamber at different temperatures for 1 h, while applying a perpendicular magnetic field of about 0.4 T. Varying layer thicknesses and annealing temperatures allows us to get insight into the performance of the magnetic sensors with different magnetic configurations. As a comparison, we have also deposited $Ta(1.6)/Co_{40}Fe_{40}B_{20}(0.9)/MgO(1.6)/TaO_x(1.0)$ on thermally oxidized silicon wafers. The sensing mode of the single $Co_{40}Fe_{40}B_{20}$ layer-based magnetic sensor was achieved by annealing samples at a moderate temperature. Since the magnetic sensor takes advantage of the anomalous Hall effect of magnetic thin films, in the following descriptions, we refer to the magnetic sensor as the anomalous Hall sensor.

To obtain the accurate anomalous Hall sensitivity, we used a coil to generate an AC perpendicular magnetic field $\Delta H_{z,0} \sin(2\pi\omega t)$, while applying a constant perpendicular field $H_z$ through the superconducting coil in the Quantum Design® Physical Property Measurement System (PPMS). The frequency $2\pi\omega=5$ Hz and $\Delta H_{z,0}=0.3$ Oe. The sensitivity $s=\Delta R_{H,0}/\Delta H_{z,0}$ at the field $H_z$ was then derived by measuring the corresponding anomalous Hall voltage response that gives the anomalous Hall resistance $R_H+\Delta R_{H,0} \sin(2\pi\omega t)$.

FIG. 1C shows anomalous Hall curves of interlayer exchange-coupled magnetic thin films with $t_{Ta}=0.6$ and 0.8 nm. The two magnetic layers are antiferromagnetically coupled when $t_{Ta}=0.6$ nm. The antiferromagnetic (AFM) coupling induces a nonlinear anomalous Hall curve with a low sensitivity (347 Ω/T) at zero magnetic field. The AFM coupling changes into ferromagnetic (FM) coupling when $t_{Ta}$ changes from 0.6 to 0.8 nm. The FM coupling is followed by the other transition into the AFM coupling when further increasing $t_{Ta}$ to 1.2 nm. The IEC strength oscillates periodically, which is attributed to the presence of Friedel-like spatial oscillations in spin density in the Ta spacer.

For the interlayer exchange-coupled magnetic thin film with $t_{Ta}=0.8$ nm, the perpendicular anisotropy increases when increasing the annealing temperature from 100 to 150° C., as presented in FIG. 1C. The increase in perpendicular anisotropy gives rise to a higher sensitivity, as shown in FIG. 1D, but also promotes the emergence of the multi-domain state. The multi-domains would increase the magnetic noise that is undesirable for magnetic sensing applications. The competition between the sensitivity and the magnetic noise motivates us to perform transport and noise measurements of magnetic thin films with different magnetic anisotropies. In the following text, we show experimental results of interlayer exchange-coupled magnetic thin films with $t_{Ta}=0.8$ nm, while magnetic thin films with other Ta spacer thicknesses possess lower magnetic sensing detectability.

Figure 2A:
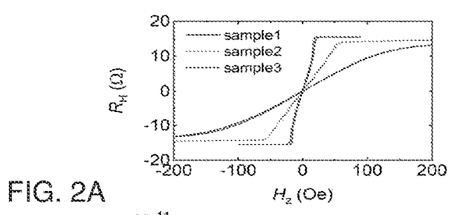
FIGS. 2A-2F are exemplary graphs.

By way of example, we focus on three magnetic thin films with different perpendicular anisotropies. We denote three samples as "sample1", "sample2" and "sample3", respectively. FIG. 2A shows anomalous Hall curves of the three magnetic thin films. The anomalous Hall curve of sample3 shows a nonlinear feature. This is the typical feature of the presence of the multi-domain state. The linear anomalous Hall curves of sample1 and sample2 suggest that magnetizations of the two samples are in the region near the spin reorientation transition.

Figure 2B:
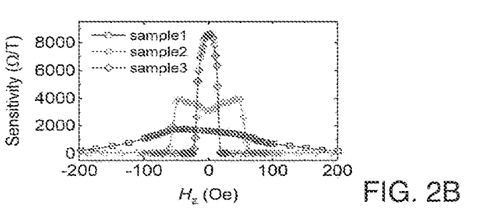

As an essential parameter to characterize the performance of anomalous Hall sensors, the sensitivity is presented in FIG. 2B. The sensitivity increases with increasing the perpendicular anisotropy, and reaches 8634 Ω/T for sample3. The sensitivity value is comparable with that of the single magnetic layer-based anomalous Hall sensor. We determine the dynamic range $2H_{DR}$ to be the same as the full width at half maximum of the $H_z$-dependence of sensitivity. The dynamic range of sample1 that has the lowest perpendicular anisotropy is 197 Oe, while the sample2 and sample3 with larger perpendicular anisotropies have lower dynamic ranges of 111 and 33 Oe, respectively.

Figure 2C:
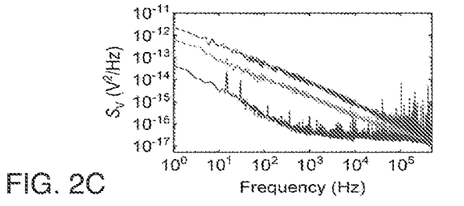

Apart from the sensitivity, noise spectra were also measured, as shown in FIG. 2C. The $H_z$-dependent noise $S_V$ at 1 Hz was derived from noise spectra and plotted in FIG. 2D. The noise spectrum includes 1/f noise and white noise. The 1/f noise that is dominant at low frequency originates from both defects and thermal magnetic fluctuations. In the sensing region, 1/f noise increases with increasing the perpendicular anisotropy. This is because of enhanced thermal magnetic fluctuations with the emergence of the multi-domain state. For sample1, the noise in the sensing region is the same as the noise in the saturation region. This implies that the magnetic 1/f noise is not as large as the defect-induced electronic 1/f noise.

Figure 2D:
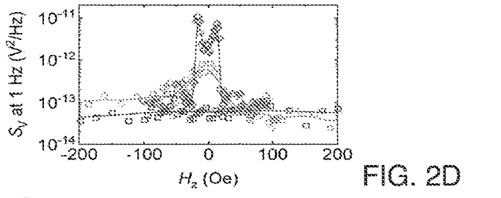
Figure 2E:
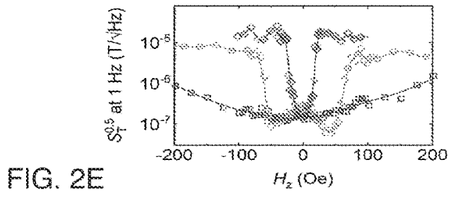

The magnetic sensing detectability was calculated through $S_T^{0.5}=S_V^{0.5}/Is$, which is plotted in FIG. 2E. The best field detectability is achieved in sample2 (60.4 nT/√Hz at 1 Hz) around the saturation region. The field detectability is better than the detectability of conventional semiconductor Hall sensors (μT/√Hz at 1 Hz) by two orders of magnitude. On the one hand, the anomalous Hall sensitivity is larger than the sensitivity of conventional semiconductor Hall sensors by one order of magnitude. On the other hand, the metallic feature of the anomalous Hall sensor allows it to possess a lower electronic noise compared with the semiconductor Hall sensor that suffers from semiconductor limitations. At zero field, the sample1 has the best field detectability (126 nT/√Hz at 1 Hz) among all three samples, and the detectability reaches 4.5 nT/√Hz at 1 kHz. The high detectability of sample1 is attributed to the low magnetic noise, although it has the lowest sensitivity among all three samples.

Figure 2F:
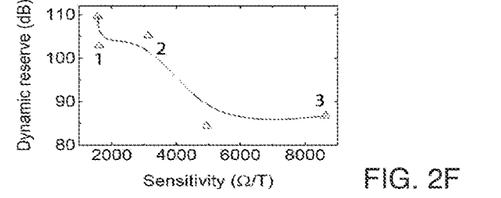
Figure 3A:
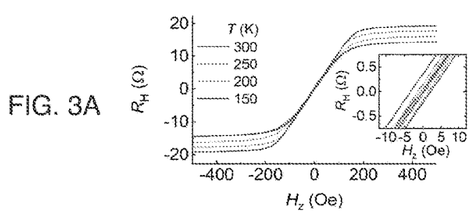
FIGS. 3A-3F are exemplary graphs.

To quantify the performance of anomalous Hall sensors, we calculated the dynamic reserve that is defined as $20 \log_{10}(2H_{DR}/S_T^{0.5}$ (at 1 Hz and zero field)), as presented in FIG. 2F. For high-performing magnetic sensors, a large dynamic reserve is expected. FIG. 3F shows that the dynamic reserve decreases with increasing the perpendicular anisotropy (sensitivity), for all three samples and the other two samples with similar structures. Sample1 that has the highest detectability at zero field has the dynamic reserve of 103.0 dB. Further decreasing the perpendicular anisotropy may increase the dynamic range, but would also reduce the sensing capability, which is undesirable for magnetic sensing. By tuning perpendicular anisotropy to the spin reorientation transition region, one expects to fabricate anomalous Hall sensors with high detectability.

FIG. 2A is an exemplary graph of anomalous Hall curves of three interlayer exchange-coupled magnetic thin films with different perpendicular anisotropies. The sample1 has the structure of $Co_{40}Fe_{40}B_{20}(0.8$ nm$)/Ta(0.8$ nm$)/Co_{40}Fe_{40}B_{20}(1.0$ nm$)$. The sample2 and sample3 have the same structure of $Co_{40}Fe_{40}B_{20}(0.9$ nm$)/Ta(0.8$ nm$)/Co_{40}Fe_{40}B_{20}(0.9$ nm$)$. The sample1 has the lowest perpendicular anisotropy. Sample2 and sample3 have stronger perpendicular magnetic anisotropies.

FIG. 2B is an exemplary graph of sensitivity as a function of the perpendicular magnetic field $H_z$ for three samples.

FIG. 2C is an exemplary graph of noise spectra for three samples measured at zero field.

FIG. 2D is an exemplary graph of the intrinsic noise at 1 Hz as a function of the perpendicular magnetic field $H_z$ for three samples.

FIG. 2E is an exemplary graph of the magnetic field detectability at 1 Hz as a function of the perpendicular magnetic field $H_z$ for three samples.

FIG. 2F is an exemplary graph of the dynamic reserve as a function of the sensitivity.

We performed transport and noise measurements of anomalous Hall sensors at different temperatures T, to investigate temperature stability of anomalous Hall sensors. FIG. 3A shows anomalous Hall curves of sample1 that were measured at 300, 250, 200 and 150 K, respectively. The anomalous Hall curve shows a much weaker temperature dependence compared with the single magnetic layer-based anomalous Hall sensors. This is what we expect as a result of the IEC in the interlayer exchange-coupled magnetic thin films. For sample1, both the saturation magnetization and coercivity increase with decreasing the temperature. The increase in coercivity is most probably due to the enhanced perpendicular anisotropy, as well as suppressed thermal fluctuations of magnetization across the field-induced magnetization switching. The slope of the anomalous Hall curve increases with decreasing the temperature. However, the temperature-dependent coercivity induces that the sensitivity increases slightly when decreasing the temperature from 300 to 200 K, and then drops with further decreasing the temperature to 150 K, as presented in FIG. 3B. Similar to the temperature-dependent sensitivity, in the sensing region, the intrinsic noise (at 1 Hz) shows ignorable variations within the temperature range from 300 to 200 K, and then increases with decreasing the temperature to 150 K, as presented in FIG. 3C. In the saturation region, the intrinsic noise decreases with decreasing the temperature. This is because of suppressed thermal fluctuations from the defects. The magnetic sensing detectability was calculated and plotted in FIG. 3D. It is noteworthy that the field detectability data measured at T=300, 250 and 200 K collapse in the sensing region. The detectability increases to about 250 nT/√Hz at 1 Hz when decreasing the temperature to 150 K. The nearly unchanged magnetic field detectability suggests that sample1 has a good temperature stability in the 300 K to 200 K temperature range. We have also performed transport and noise measurements of sample2 and sample3 at different temperatures. We plotted the temperature-dependent field detectability (at zero field and 1 Hz) and dynamic reserve, for all three samples, in FIG. 3E and FIG. 3F, respectively. The sample1 that has the highest detectability at zero field, also has the best temperature stability among all three samples. We used a temperature coefficient of sensitivity that is defined as $|\Delta s/s \Delta T|$ to quantify temperature stability. The temperature coefficients for sample1, sample2 and sample3 are 530, 4060 and 6800 ppm/K, respectively, in the temperature range from 200 to 300 K. The temperature coefficient of sensitivity (530 ppm/K for sample1) has the same order of magnitude as the temperature coefficient of conventional semiconductor Hall sensors. However, in semiconductor Hall sensors, reaching such a low temperature coefficient requires sacrificing the sensitivity ($<10^2$ Ω/T). Our results suggest that the interlayer exchange-coupled magnetic thin film-based anomalous Hall sensors outperform semiconductor Hall sensors in sensitivity, field detectability and temperature stability.

As a comparison, we also measured magnetotransport and noise properties of the single $Co_{40}Fe_{40}B_{20}$ layer-based anomalous Hall sensor in the temperature range from 310 to 250 K. The temperature-dependent magnetic field detectability at 1 Hz at a bias field $H_B$=−14 Oe (at which the field detectability value is lowest) is also presented in FIG. 4. The results show that the field detectability of the single $Co_{40}Fe_{40}B_{20}$ layer-based anomalous Hall sensor has a stronger temperature dependence, compared with the interlayer exchange-coupled magnetic thin films. The temperature coefficient of sensitivity of the single $Co_{40}Fe_{40}B_{20}$ layer system is calculated to be 6540 ppm/K in the 310 to 250 K temperature range, which is much larger than the temperature coefficient of sensitivity (530 ppm/K) of sample 1 measured in a broader temperature range from 300 to 200 K. These results confirm that the interlayer exchange-coupled magnetic thin film-based anomalous Hall sensor has a better temperature stability, compared with the single magnetic layer-based anomalous Hall sensor, as a result of the IEC between magnetic layers in the multilayer structure.

FIG. 3A is an exemplary graph of the anomalous Hall curves of sample1 that were measured at 300, 250, 200 and 150 K, respectively. The sample1 has the structure of $Co_{40}Fe_{40}B_{20}$(0.8 nm)/Ta(0.8 nm)/$Co_{40}Fe_{40}B_{20}$(1.0 nm).

Figure 3B:
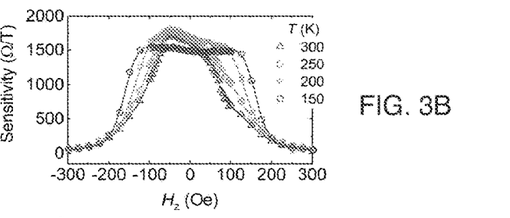

FIG. 3B is an exemplary graph of the anomalous Hall sensitivity as a function of the perpendicular magnetic field $H_z$ for sample1, measured at 300, 250, 200 and 150 K, respectively.

Figure 3C:
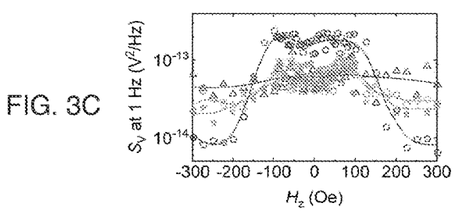

FIG. 3C is an exemplary graph of the intrinsic noise at 1 Hz as a function of the perpendicular magnetic field $H_z$ for sample1, measured at 300, 250, 200 and 150 K, respectively.

Figure 3D:
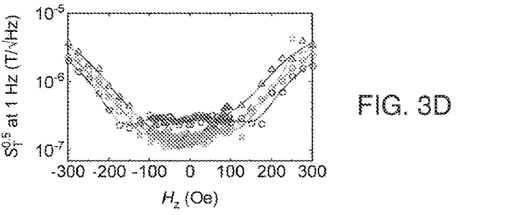

FIG. 3D is an exemplary graph of the magnetic field detectability at 1 Hz as a function of the perpendicular magnetic field $H_z$ for sample1, measured at 300, 250, 200 and 150 K, respectively.

Figure 3E:
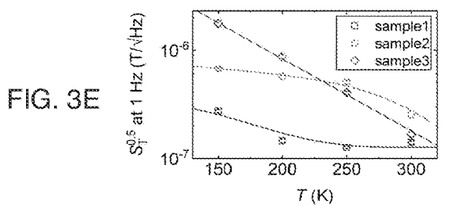
Figure 3F:
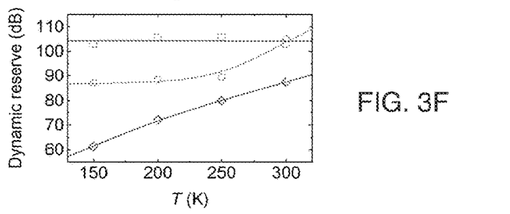

FIG. 3E is an exemplary graph of the temperature dependence of the magnetic field detectability for sample1, sample2 and sample3. The sample1 has the structure of $Co_{40}Fe_{40}B_{20}$(0.8 nm)/Ta(0.8 nm)/$Co_{40}Fe_{40}B_{20}$(1.0 nm). The sample2 and sample3 have the same structure of $Co_{40}Fe_{40}B_{20}$(0.9 nm)/Ta(0.8 nm)/$Co_{40}Fe_{40}B_{20}$(0.9 nm). The field detectability of single $Co_{40}Fe_{40}B_{20}$ layer-based anomalous Hall sensor is also present.

FIG. 3F is an exemplary graph of the temperature dependence of the dynamic reserve for sample1, sample2 and sample3.

Figure 4:
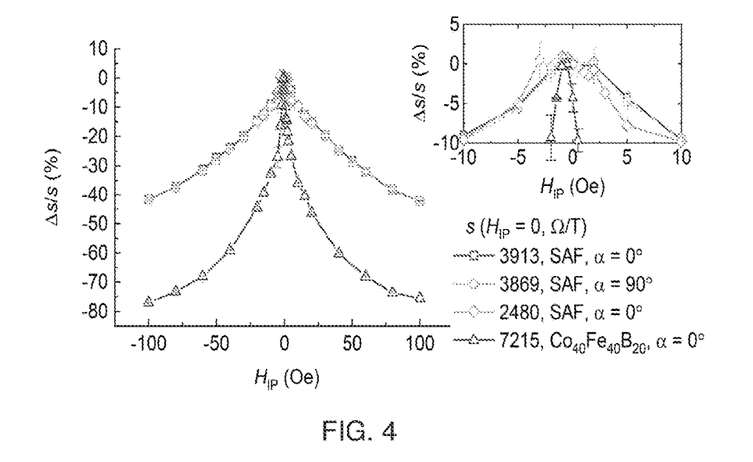
FIG. 4 is an exemplary graph.

In addition to the temperature stability, reaching high tolerance to orthogonal magnetic fields is essential as well for anomalous Hall sensors in applications of perpendicular magnetic field sensing. The IEC in magnetic thin films is expected to enhance the stability. To confirm this, we measured anomalous Hall curves of both interlayer exchange-coupled magnetic thin film-based and the single $Co_{40}Fe_{40}B_{20}$ layer-based anomalous Hall sensors, while applying an in-plane magnetic field $H_{IP}$. $H_{IP}$ was applied either parallel (α=0°) or perpendicular (α=90°) to the current flow direction. FIG. 4 shows that the relative changes ($\Delta s/s = (s(H_{IP})-s(H_{IP}=0))/s(H_{IP}=0)$) of the sensitivity increases with $|H_{IP}|$, but is independent of the in-plane field direction and the perpendicular anisotropy that determines $s(H_{IP}=0)$. We used the value of $|\Delta s/s|$ to characterize the cross-field error. The interlayer exchange-coupled magnetic thin film shows a lower cross-field error compared with the single $Co_{40}Fe_{40}B_{20}$ layer-based anomalous Hall sensor. Especially, when $|H_{IP}|<2$ Oe, the Δs/s keeps at about 0% for interlayer exchange-coupled magnetic thin films, while it changes by almost 10% for the single $Co_{40}Fe_{40}B_{20}$ layer system. The IEC-improved temperature stability and tolerance to in-plane magnetic fields make anomalous Hall sensors highly promising in magnetic sensing applications under wide-ranging environmental conditions.

FIG. 4 is an exemplary graph of the relative changes ($\Delta$s/s) of the anomalous Hall sensitivity as a function of in-plane magnetic field $H_{IP}$. The $\Delta$s/s was derived from the slope of anomalous Hall curves of magnetic thin films with different s($H_{IP}$=0). We have also plotted $\Delta$s/s for a single $Co_{40}Fe_{40}B_{20}$ layer-based anomalous Hall sensor (green). $\alpha$=0° (90°) means that the $H_{IP}$ was applied parallel (perpendicular) to the current flow direction. The insert is the partial enlarged figure. Error bars were derived from multiple measurements.

Figure 5A:
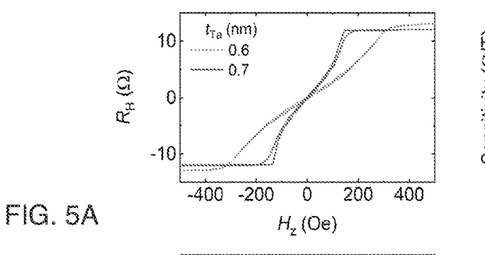
FIGS. 5A-5D are exemplary graphs.
Figure 5B:
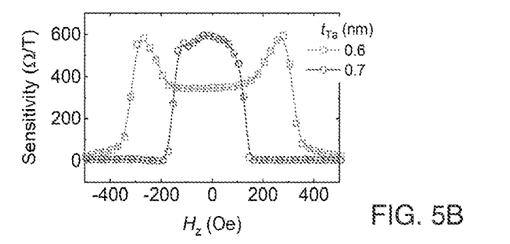

The interlayer exchange-coupled magnetic thin film-based anomalous hall sensor has an outstanding performance with both high detectability and high stability. To achieve the best performance of anomalous Hall sensors, we have also performed transport and noise measurements of magnetic thin films with different magnetic layer thicknesses and $t_{Ta}$. Magnetic layer thicknesses ($t_1$=0.8, 0.9 and 1.0 nm) have ignorable influences on the performance of anomalous Hall sensors. The $t_{Ta}$ controls the IEC strength. FIG. 5A shows anomalous Hall curves of interlayer exchange-coupled magnetic thin films with $t_{Ta}$=0.6 and 0.7 nm, respectively. In both magnetic thin films, the two ferromagnetic layers are antiferromagnetically coupled. The saturation field for the magnetic thin film with $t_{Ta}$=0.7 nm is smaller than the saturation field for the magnetic thin film with $t_{Ta}$=0.6 nm. This infers that the IEC strength of the magnetic thin film with $t_{Ta}$=0.7 nm is weaker than the IEC strength of the magnetic thin film with $t_{Ta}$=0.6 nm. FIG. 5B shows the H-dependence of the sensitivity. For the magnetic thin film with $t_{Ta}$=0.6 nm, two peaks are observed near the positive and negative saturation fields. The $H_z$-dependence of the sensitivity well follows the variation trend of the Hall slope as a function of $H_z$ that with increasing the perpendicular magnetic field from the negative saturation field to positive saturation field, the Hall slope increases first, and then decreases around zero field, and then increases near the positive saturation field. The two peaks disappear for the magnetic thin film with $t_{Ta}$=0.7 nm. This is possibly owing to the irreversible curves near the saturation field. The irreversible curves not only decrease the sensitivity, but also increase the intrinsic noise, as presented in FIG. 5C. Even though, in the region around zero field, the anomalous Hall curve becomes linear and reversible with a small coercivity, which can be employed for magnetic field sensing. The electronic noises for two samples are presented in FIG. 5C. In the sensing region, the electronic noise for the magnetic thin film with $t_{Ta}$=0.6 nm is smaller than the electronic noise for the magnetic thin film with $t_{Ta}$=0.7 nm. The electronic noise increases near the saturation fields for both samples. For the magnetic thin film with $t_{Ta}$=0.6 nm, this is because of the increase in the sensitivity. For the magnetic thin film with $t_{Ta}$=0.7 nm, this is because of the irreversible curves. We calculated the detectability and plotted it in FIG. 5D. At zero field, the detectability reaches 577.1 nT/√Hz at 1 Hz for the magnetic thin film with $t_{Ta}$=0.6 nm, and it reaches 417.7 nT/√Hz at 1 Hz for the magnetic thin film with $t_{Ta}$=0.6 nm. The magnetic field detectabilities for both samples are larger than that of magnetic thin films with $t_{Ta}$=0.8 nm. Even though, the antiferromagnetic coupling structures have the low stray field and are expected to possess a better temperature stability and a lower cross-field error. By tuning the IEC and perpendicular magnetic anisotropy to moderate values, the anomalous Hall sensors with both high detectability and high stability can be fabricated for magnetic sensing.

FIG. 5A is an exemplary graph of anomalous Hall curves of interlayer exchange-coupled magnetic thin films of $Co_{40}Fe_{40}B_{20}$(0.9 nm)/Ta(0.6 nm)/$Co_{40}Fe_{40}B_{20}$(0.9 nm) and $Co_{40}Fe_{40}B_{20}$(0.9 nm)/Ta(0.7 nm)/$Co_{40}Fe_{40}B_{20}$(0.9 nm).

FIG. 5B is an exemplary graph of the anomalous Hall sensitivity as a function of the perpendicular magnetic field $H_z$ for magnetic thin films of $Co_{40}Fe_{40}B_{20}$(0.9 nm)/Ta(0.6 nm)/$Co_{40}Fe_{40}B_{20}$(0.9 nm) (square dots) and $Co_{40}Fe_{40}B_{20}$(0.9 nm)/Ta(0.7 nm)/$Co_{40}Fe_{40}B_{20}$(0.9 nm) (circle dots), respectively.

Figure 5C:
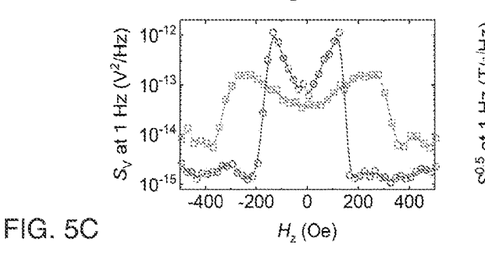

FIG. 5C is an exemplary graph of the intrinsic noise as a function of the perpendicular magnetic field $H_z$ for magnetic thin films of $Co_{40}Fe_{40}B_{20}$(0.9 nm)/Ta(0.6 nm)/$Co_{40}Fe_{40}B_{20}$(0.9 nm) (square dots) and $Co_{40}Fe_{40}B_{20}$(0.9 nm)/Ta(0.7 nm)/$Co_{40}Fe_{40}B_{20}$(0.9 nm) (circle dots), respectively.

Figure 5D:
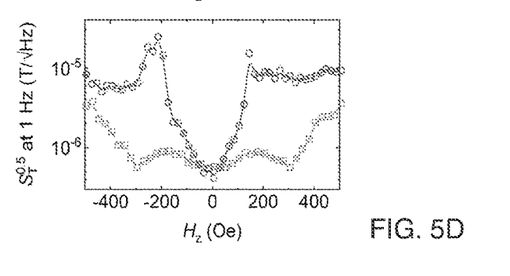

FIG. 5D is an exemplary graph of the magnetic field detectability as a function of the perpendicular magnetic field $H_z$ for magnetic thin films of $Co_{40}Fe_{40}B_{20}$(0.9 nm)/Ta (0.6 nm)/$Co_{40}Fe_{40}B_{20}$(0.9 nm) (square dots) and $Co_{40}Fe_{40}B_{20}$(0.9 nm)/Ta(0.7 nm)/$Co_{40}Fe_{40}B_{20}$(0.9 nm) (circle dots), respectively.

The anomalous Hall angle $\theta_{AHE}=\rho_H/\rho_{xx}$ was calculated to characterize the efficiency of anomalous Hall sensors. $\rho_H$ is the anomalous Hall resistivity, and $\rho_{xx}$ is the longitudinal resistivity. For the magnetic thin film of $Co_{40}Fe_{40}B_{20}$/Ta/$Co_{40}Fe_{40}B_{20}$, the anomalous Hall angle was determined to be about 0.7%. One expects that, by replacing $Co_{40}Fe_{40}B_{20}$ with other magnets, such as FePt, with larger anomalous Hall angles, the efficiency of anomalous Hall sensors can be improved. Anomalous Hall sensors with different material compositions remain to be explored.

Among magnetic sensors with miniaturized sizes, besides Hall sensors, the giant magnetoresistance (GMR) sensor and tunneling magnetoresistance (TMR) sensor have also been attracting great interest. Nevertheless, both GMR and TMR sensors are fabricated with much more complex fabrication processes. The GMR sensor performs with a high power consumption. A better magnetic sensing detectability can be achieved in TMR sensors based on magnetic tunnel junctions (MTJs). However, TMR sensor usually suffers from large 1/f noise, which scales inversely with junction areas and limits its performance with small sizes. In a TMR sensor with superparamagnetic free layer, the achieved magnetic field detectability is 40 nT/√Hz at 1 Hz, one third of that of the anomalous Hall sensors in this work, yet the sensing area is 14 times larger. If the same sensing area is used, one may expect that the anomalous Hall sensor performs comparably or even outperforms TMR sensor in the low-frequency region.

In general, we have succeeded in fabricating high-performing anomalous Hall sensors with both high detectability and high stability, exploiting the interlayer exchange-coupled magnetic thin film of $Co_{40}Fe_{40}B_{20}$/Ta/$Co_{40}Fe_{40}B_{20}$. We performed transport and noise measurements to characterize the magnetic sensing capability of anomalous Hall sensors. By tuning the IEC and perpendicular magnetic anisotropy, at room temperature, the best magnetic sensing detectability reaches 126 nT/√Hz at 1 Hz and 4.5 nT/√Hz at 1 kHz. The interlayer exchange-coupled magnetic thin film with the best performance has a Ta spacer with the spacer thickness of 0.8 nm, two ferromagnetic $Co_{40}Fe_{40}B_{20}$ layers that sandwich the Ta spacer, and the other two MgO layers that sandwich the trilayer structure comprising the two ferromagnetic $Co_{40}Fe_{40}B_{20}$ layers and the Ta spacer. The anomalous Hall sensor with such a structure has a large dynamic range of 197 Oe and a large dynamic reserve of 103.0 dB. The anomalous Hall sensors outperform the conventional semiconductor Hall sensors in both sensitivity and detectability. Temperature-dependent studies were conducted. Benefiting from the IEC in interlayer exchange-coupled magnetic thin films, the anomalous Hall sensor has a low temperature coefficient of sensitivity of 530 ppm/K. The low temperature coefficient of the anomalous Hall sensor suggests it is possible to work within a broad temperature interval. The IEC also improves the tolerance of anomalous Hall sensors to orthogonal magnetic fields. The high stability against both temperature and in-plane magnetic fields allows the anomalous Hall sensor to be applied in magnetic sensing under wide-ranging environmental conditions. The high-performing anomalous Hall sensors with the miniaturized size have great potential in applications of micro sensing such as detection of biomolecules and magnetic imaging. If combining anomalous Hall sensors and GMR or TMR sensors together, one expects to detect three-dimensional magnetic field with high field resolution.

It would be appreciated by those skilled in the art that various changes and modifications can be made to the illustrated embodiments without departing from the spirit of the present invention. All such modifications and changes are intended to be within the scope of the present invention except as limited by the scope of the appended claims.

What is claimed is:

1. A magnetic field sensing device comprising:
   a magnetic field sensing element with a Hall measurement configuration for Hall-signal detection and analysis, the magnetic field sensing element fabricated with an interlayer exchange-coupled magnetic multilayer structure comprising:
   a spacer that couples two magnetic layers that sandwich the spacer, the spacer thickness determining either the ferromagnetic coupling or the antiferromagnetic coupling between the two magnetic layers;
   two magnetic layers that sandwich the spacer, the two magnetic layers having tunable perpendicular magnetic anisotropies near a spin-reorientation transition;
   two oxide layers or other non-magnetic layers that sandwich the two magnetic layers and the spacer, the two oxide layers or other non-magnetic layers having interfaces with the two magnetic layers, the interfaces determining the perpendicular magnetic anisotropies of the two magnetic layers; and
   a capping layer to prevent underlying layers from further oxidization on exposure to the atmosphere.

2. The structure of claim 1 wherein the spacer comprises at least one of the following properties:
   the strength of the interlayer exchange coupling is selected from the group consisting of: at least 0.0001 milli-joule divided by square-meters ([mJ/m$^2$] at least 0.0005 mJ/m$^2$, at least 0.001 mJ/m$^2$, at least 0.005 mJ/m$^2$, at least 0.01 mJ/m$^2$, at least 0.05 mJ/m$^2$, at least 0.1 mJ/m$^2$, at least 0.5 mJ/m$^2$, at least 1 mJ/m$^2$, at least 5 mJ/m$^2$;
   is at least one metal, semiconducting, insulating or organic material selected from the group consisting of: tantalum, tungsten, niobium, molybdenum, vanadium, chromium, rhenium, ruthenium, iridium, copper, rhodium, scandium, titanium, yttrium, zirconium, palladium, hafnium, osmium, platinum, gold, gallium, germanium, arsenic, selenium, indium, tin, antimony, tellurium, thallium, lead, bismuth, silicon, vanadium dioxide, gallium arsenide, magnesium oxide, α-sexithiphene, and alloys or compounds composed of any two or more above materials.

3. The structure of claim 1, wherein the magnetic layers comprise at least one of the following properties:
   an anomalous Hall angle is selected from the group consisting of: at least 0.1%, at least 0.5%, at least 1%, at least 5%, at least 10%, at least 15%, at least 20%, at least 25%, at least 30%, at least 35%, at least 40%, at least 45%, at least 50%;
   has the anomalous Hall resistivity selected from the group consisting of: at least 0.1 micro-Ohm centimeters (μΩ cm), at least 0.5μΩ cm, at least 1μΩ cm, at least 5μΩ cm, at least 10μΩ cm, at least 50μΩ cm, at least 100 μΩ cm;
   has a saturation field selected from the group consisting of: at least 0.1 Oersted unit (Oe), at least 1 Oe, at least 10 Oe, at least 100 Oe, at least 1000 Oe, at least 10000 Oe;
   are ferromagnetic films or ferrimagnetic films;
   have perpendicular magnetic anisotropies near the spin-reorientation transition or have in-plane anisotropies; and
   the ferromagnetic film is the alloy of Cobalt-Iron-Boron with x, y, and 100−x−y as atomic percentage of Cobalt, Iron and Boron atoms (Co$_x$Fe$_y$B100−x−y) wherein 0<x<100 and 0<y<100 (atomic percent);
   have interfaces with oxide layers, with other non-magnetic layers, or have no interfaces with any other materials.

4. The structure of claim 1, wherein the oxide layers comprise at least one of the following properties:
   have interfaces with magnetic layers; and
   are at least one oxide selected from the group consisting of: magnesium oxide, aluminum oxide, tantalum oxide, ruthenium oxide, chromium oxide, tungsten oxide, platinum oxide, silicon oxide, niobium oxide, molybdenum oxide, vanadium oxide, rhenium oxide, iridium oxide, copper oxide, rhodium oxide, scandium oxide, titanium oxide, yttrium oxide, zirconium oxide, palladium oxide, hafnium oxide, osmium oxide, gold oxide, gallium oxide, germanium oxide, arsenic oxide, selenium oxide, indium oxide, tin oxide, antimony oxide, tellurium oxide, thallium oxide, lead oxide, bismuth oxide;
   are replaced by other non-magnetic layers selected from the group consisting of: tantalum, tungsten, niobium, molybdenum, vanadium, chromium, rhenium, ruthenium, iridium, copper, rhodium, scandium, titanium, yttrium, zirconium, palladium, hafnium, osmium, platinum, gold, gallium, germanium, arsenic, selenium, indium, tin, antimony, tellurium, thallium, lead, bismuth, silicon, and alloys or compounds composed of any two or more above materials.

5. The structure of claim 1, further comprising a capping layer or overlayer to prevent from further oxidization on exposure to the atmosphere.

6. The structure of claim 1, further comprising inserted layers between any two layers to improve magnetic or electronic properties of magnetic multilayers for magnetic sensing devices.

7. The structure of claim 1, wherein the multilayer compositions are annealed to obtain appropriate interlayer exchange coupling and perpendicular magnetic anisotropies for magnetic sensing devices.

8. The structure of claim 1, wherein the multilayer compositions are annealed at an annealing temperature selected from the group consisting of: at least 20 degrees Celsius (° C.) at least 50° C., at least 100° C., at least 150° C., at least 200° C., at least 250° C., at least 300° C., at least 350° C., at least 400° C.

9. The structure of claim 1, wherein the multilayer compositions are annealed under a magnetic field perpendicular to or in the plane of the multilayer composition having a strength selected from the group consisting of: at least 0.01 Tesla (T), at least 0.1 T, at least 1.0 T, at least 10 T, at least 20 T.

10. The structure of claim 2, wherein the spacer has a thickness selected from a range of 0.1 nanometers (nm) to 10 nm, for example, 0.1 nm to 1.0 nm, 0.6 nm to 1.4 nm, 0.5 nm to 5.0 nm, or 5.0 nm to 10.0 nm.

* * * * *